(12) United States Patent
Cao et al.

(10) Patent No.: US 9,997,136 B2
(45) Date of Patent: Jun. 12, 2018

(54) DISPLAY CIRCUIT AND DRIVING METHOD AND DISPLAY APPARATUS THEREOF (71) Applicant: BOE TECHNOLOGY GROUP CO., LTD., Beijing (CN)

(72) Inventors: Kun Cao, Beijing (CN); Zhongyuan Wu, Beijing (CN); Chen Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 45 days.

(21) Appl. No.: 14/787,893

(22) PCT Filed: Apr. 24, 2015

(86) PCT No.: PCT/CN2015/077376
§ 371 (c)(1),
(2) Date: Oct. 29, 2015

(87) PCT Pub. No.: WO2016/058351
PCT Pub. Date: Apr. 21, 2016

(65) Prior Publication Data
US 2016/0189677 A1 Jun. 30, 2016

(30) Foreign Application Priority Data
Oct. 17, 2014 (CN) .......................... 2014 1 0554799

(51) Int. Cl.
G09G 5/10 (2006.01)
G09G 3/3266 (2016.01)
G11C 19/28 (2006.01)

(52) U.S. Cl.
CPC ............. *G09G 5/10* (2013.01); *G09G 3/3266* (2013.01); *G11C 19/287* (2013.01);
(Continued)

(58) Field of Classification Search
CPC ...... G11C 19/287; G09G 3/3266; G09G 5/10; G09G 2310/0262; G09G 2310/0286;
(Continued)

(56) References Cited

U.S. PATENT DOCUMENTS 7,843,221 B2    11/2010   Jinta
2005/0093464 A1  5/2005   Shin
(Continued)

FOREIGN PATENT DOCUMENTS

CN    1846243 A    10/2006
CN    1860519 A    11/2006
(Continued)

OTHER PUBLICATIONS

International Search Report and Written Opinion dated Jul. 15, 2015.
(Continued)

Primary Examiner — Kwang-Su Yang
(74) Attorney, Agent, or Firm — Dilworth & Barrese, LLP.; Michael J. Musella, Esq.

(57) ABSTRACT

A display circuit and a driving method thereof and a display apparatus are provided. The display circuit comprises a pixel unit (11), a first gate driving unit (12) and a second gate driving unit (13); wherein the first gate driving unit (12) is configured to input a first gate driving signal to the pixel unit (11); the second gate driving unit (13) is configured to input a second gate driving signal to the pixel unit (11); and the pixel unit (11) is configured to perform threshold compensating and gray scale displaying simultaneously under the control of the first gate driving signal and the second gate driving signal. The apparatus and method is capable of reducing the complexity in design of the display circuit,
(Continued)

which is advantageous for raising density of pixels of the display panel. The apparatus and method are applicable to manufacture a display.

17 Claims, 7 Drawing Sheets

(52) U.S. Cl.
CPC .............. *G09G 2300/0408* (2013.01); *G09G 2310/0262* (2013.01); *G09G 2310/0286* (2013.01); *G09G 2310/061* (2013.01); *G09G 2310/08* (2013.01); *G09G 2320/043* (2013.01); *G09G 2320/045* (2013.01); *G09G 2330/021* (2013.01)

(58) Field of Classification Search
CPC ....... G09G 2320/043; G09G 2320/045; G09G 2310/061; G09G 2310/08; G09G 2330/021; G09G 2300/0408
See application file for complete search history.

(56) References Cited

U.S. PATENT DOCUMENTS

| | | | |
|---|---|---|---|
| 2005/0093804 A1* | 5/2005 | Yamazaki | G09G 3/2018 345/92 |
| 2005/0201508 A1 | 9/2005 | Shin et al. | |
| 2005/0280614 A1 | 12/2005 | Goh | |
| 2006/0158398 A1 | 7/2006 | Akimoto et al. | |
| 2007/0024546 A1 | 2/2007 | Jang et al. | |
| 2007/0075938 A1 | 4/2007 | Sung et al. | |
| 2008/0018629 A1 | 1/2008 | Uchino et al. | |
| 2008/0079001 A1 | 4/2008 | Umezaki et al. | |
| 2008/0266477 A1 | 10/2008 | Lee et al. | |
| 2009/0237123 A1 | 9/2009 | Jinta | |
| 2010/0053047 A1 | 3/2010 | Chen et al. | |
| 2010/0053233 A1 | 3/2010 | Ishiguro et al. | |
| 2011/0279430 A1 | 11/2011 | Koh | |
| 2012/0019499 A1 | 1/2012 | Hwang et al. | |
| 2014/0168282 A1* | 6/2014 | Mun | G09G 3/3266 345/690 |
| 2015/0009113 A1* | 1/2015 | Zeng | G09G 3/3677 345/100 |
| 2015/0145757 A1* | 5/2015 | Asano | G09G 3/2022 345/77 |
| 2016/0063961 A1* | 3/2016 | Pyo | G09G 3/2022 345/213 |
| 2016/0247446 A1* | 8/2016 | Cao | G09G 3/3225 |

FOREIGN PATENT DOCUMENTS

| | | |
|---|---|---|
| CN | 1901017 A | 1/2007 |
| CN | 101154342 A | 4/2008 |
| CN | 101191920 A | 6/2008 |
| CN | 101192381 A | 6/2008 |
| CN | 101276548 A | 10/2008 |
| CN | 101295481 A | 10/2008 |
| CN | 100476941 C | 4/2009 |
| CN | 101408684 A | 4/2009 |
| CN | 101866519 A | 10/2010 |
| CN | 201681587 U | 12/2010 |
| CN | 102654968 A | 9/2012 |
| CN | 13077662 A | 5/2013 |
| CN | 103165079 A | 6/2013 |
| CN | 103345941 A | 10/2013 |
| CN | 103578411 A | 2/2014 |
| CN | 103941439 A | 7/2014 |
| CN | 10482270 A | 1/2015 |
| CN | 104282269 A | 1/2015 |
| CN | 104282270 A | 1/2015 |
| EP | 3208792 A1 | 8/2017 |
| JP | 2006251515 A | 9/2006 |
| KR | 20060041045 A | 5/2006 |
| KR | 20080010986 A | 1/2008 |

OTHER PUBLICATIONS

Chinese Office Action dated Mar. 2, 2016.
Office Action of U.S. Appl. No. 14/787,934, dated Jun. 14, 2017.
Requirement for Restriction U.S. Appl. No. 14/787,934, dated Mar. 27, 2017.
International Search Report dated Jul. 3, 2015.
First Chinese Office Action dated Feb. 29, 2016.
European Search Report issued by the European Patent Office for the corresponding European Patent Application No. 15775602.4 dated Mar. 12, 2018.
European Search Report issued by the European Patent Office for the corresponding European Patent Application No. 15775603.2 dated Apr. 24, 2018.

* cited by examiner

DISPLAY CIRCUIT AND DRIVING METHOD AND DISPLAY APPARATUS THEREOF

TECHNICAL FIELD

The present disclosure relates to a display circuit, a driving method thereof and a display apparatus.

BACKGROUND

Since a design of an organic light-emitting diode (OLED) pixel adopts a current-controlled type mostly, threshold voltages (Vth) of driving transistors of respective pixel units inside an entire panel are non-uniform and Vth offset produced after operating for a long period would reduce uniformity of display of the panel. Therefore, the above problem is avoided by a Vth compensation pixel design. In order to raise a process integration of an OLED display panel, and at the same time reduce the cost, adopting gate driver on array (GOA) technology is a development trend in the future. However, the Vth compensation pixel design of OLED needs a peripheral gate driving circuit to cooperate therewith to provide a driving signal for performing the Vth compensation process. Therefore, a high requirement is proposed for the gate driving circuit.

At present, the design of the display circuit is mainly a pixel design simply having a Vth compensating function cooperating with a single-pulse GOA circuit design. Generally, the pixel design having the Vth compensating function realizes Vth compensating of pixels in the pixel unit by performing conversion of signal of several timings on a data line signal Vdata through a threshold compensating module composed of a switching logic device. In addition, besides providing a gate driving signal, the single-pulse GOA circuit must be capable of providing a timing signal matching with the Vth compensation of pixels. The Vth compensating function and the gate driving function are performed independently. Therefore, the design of the display circuit is relatively complicated, which is disadvantageous for raising density of pixels of the display panel.

SUMMARY

There are provided in some embodiments of the present disclosure a display circuit, a driving method thereof and a display apparatus, which are capable of reducing complexity in design of the display circuit and are advantageous for raising density of pixels of a display panel.

According to one aspect of the present disclosure, there is provided a display circuit, comprising a pixel unit, a first gate driving unit and a second gate driving unit.

The first gate driving unit is configured to input a first gate driving signal to the pixel unit.

The second gate driving unit is configured to input a second gate driving signal to the pixel unit.

The pixel unit is configured to perform threshold compensating and gray scale displaying simultaneously under the control of the first gate driving signal and the second gate driving signal.

Optionally, the first gate driving unit comprises at least three GOA units, each of which comprises a signal input terminal, an output terminal, a reset terminal and an idle output terminal.

A signal input terminal of a first stage of GOA unit is input with a first frame start signal, and a reset terminal thereof is connected to an idle output terminal of a third stage of GOA unit.

A signal input terminal of a second stage of GOA unit is input with a second frame start signal.

A reset terminal of a 2n-th stage of GOA unit is connected to an idle output terminal of a (2n−1)-th stage of GOA unit and a signal input terminal of a (2n+1)-th stage of GOA unit.

A reset terminal of the (2n+1)-th stage of GOA unit is connected to an idle output terminal of a (2n+3)-th stage of GOA unit.

A signal input terminal of a (2n+2)-th stage of GOA unit is connected to an idle output terminal of a 2n-th stage of GOA unit.

An output terminal of the 2n-th stage of GOA unit and an output terminal of the (2n+1)-th stage of GOA unit output the first gate driving signal to a pixel unit in a n-th row through a logic or unit, where n is a positive integer.

Optionally, the second gate driving unit comprises at least three GOA units, each of which comprises a signal input terminal, an output terminal, a reset terminal and an idle output terminal.

A signal input terminal of a first stage of GOA unit is input with a third frame start signal, and a reset terminal thereof is connected to a idle output terminal of a third stage of GOA unit.

The signal input terminal of a second stage of GOA unit is input with a fourth frame start signal.

A reset terminal of a 2n-th stage of GOA unit is connected to an idle output terminal of a (2n−1)-th stage of GOA unit and a signal input terminal of a (2n+1)-th stage of GOA unit.

A reset terminal of the (2n+1)-th stage of GOA unit is connected to an idle output terminal of a (2n+3)-th stage of GOA unit.

A signal input terminal of a (2n+2)-th stage of GOA unit is connected to an idle output terminal of a 2n-th stage of GOA unit.

An output terminal of the 2n-th stage of GOA unit and an output terminal of the (2n+1)-th stage of GOA unit are connected to an input terminal of a logic or unit, an output terminal of the logic or unit is connected to an input terminal of a logic inverse unit, and an output terminal of the logic inverse unit outputs the second gate driving signal, where n is a positive integer.

Optionally, the second gate driving unit comprises at least a pair of GOA units, each of which comprises a signal input terminal, an output terminal, a reset terminal and an idle output terminal.

Except for the first stage of GOA unit and the second stage of GOA unit, a signal input terminal of a m-th stage of GOA unit is connected to an idle output terminal of a (m−2)-th stage of GOA unit; a reset terminal of the m-th stage of GOA unit is connected to an idle output terminal of a (m+1)-th stage of GOA unit; a signal input terminal of a (m+1)-th stage of GOA unit is connected to an idle output terminal of a (m−1)-th stage of GOA unit; and a reset terminal of the (m+1)-th stage of GOA unit is connected to an idle output terminal of a (m+3)-th stage of GOA unit.

The reset terminal of the first stage of GOA unit is connected to the idle output terminal of the second stage of GOA unit; the reset terminal of the second stage of GOA unit is connected to the idle output terminal of a fourth stage of GOA unit.

Herein, the signal input terminal of the first stage of GOA unit is input with a fifth frame start signal, and the signal input terminal of the second stage of GOA unit is input with a sixth frame start signal.

The output terminal of the m-th stage of GOA unit outputs the second gate driving signal to a pixel unit in a (m+1)/2-th row through the logic inverse unit, where m is an odd number.

Optionally, the GOA unit comprises: a pull-up unit, a pull-down unit, a reset unit, an idle output unit and an output unit.

The pull-up unit is connected to the signal input terminal, a first level terminal, a first clock signal terminal, a second clock signal terminal, a first node, a second node, a third node and a fourth node; wherein the pull-up unit is configured to make a voltage of the first node consistent with the signal input terminal, make a voltage of the second node consistent with the signal input terminal or make the voltage of the second node consistent with a voltage of the fourth node, make a voltage of the third node consistent with a voltage of the first level terminal, and make the voltage of the fourth node consistent with a voltage of the first clock signal terminal under the control of signals of the signal input terminal, the first level terminal, the first clock signal terminal and the second clock signal terminal.

The pull-down unit is connected to a second level terminal, a third level terminal, the idle output terminal, the output terminal, a first node, a second node, a third node and a fourth node, and is configured to make a voltage of the third node consistent with the second level terminal under the control of a signal of the first node, make voltages of the first node and the second node consistent with the second level terminal under the control of a signal of the third node, make a voltage of the output terminal consistent with the second level terminal under the control of the signal of the third node, make a voltage of the output terminal consistent with the third level terminal under the control of the signal of the third node, and make a voltage of the fourth node consistent with the third level terminal under the control of the signal of the third node.

The reset unit is connected to the reset terminal, the second level terminal, the first node and the second node, and is configured to make the voltages of the first node and the second node consistent with the second level terminal under the control of a signal of the reset terminal.

The idle output unit is connected to the first node, the second clock signal terminal and the idle output terminal, and is configured to output a signal of the second clock signal terminal at the idle output terminal under the control of the first node.

The output unit is connected to the first node, the second clock signal terminal and the output terminal, and is configured to output the signal of the second clock signal terminal at the output terminal under the control of the first node.

Optionally, the idle output unit comprises: a first transistor, whose gate is connected to the first node, source is connected to the second clock signal terminal, and drain is connected to the idle output terminal.

Optionally, the pull-up unit comprises: a fourth transistor, a sixth transistor, a seventh transistor, an eleventh transistor, and a fourteenth transistor.

A gate and a source of the fourth transistor are connected to the first level terminal, and a drain thereof is connected to the third node.

A gate and a source of the sixth transistor are connected to the signal input terminal, and a drain thereof is connected to the second node.

A gate of the seventh transistor is connected to the first node, a source thereof is connected to the second clock signal terminal, and a drain thereof is connected to the fourth node.

A gate of the eleventh transistor is connected to the idle output terminal, a source thereof is connected to the second node, and a drain thereof is connected to the fourth node.

A gate of the fourteenth transistor is connected to the first clock signal terminal, a source thereof is connected to the second node, and a drain thereof is connected to the first node.

Optionally, the pull-down unit comprises: a second transistor, a third transistor, a fifth transistor, an eighth transistor, a tenth transistor and a thirteenth transistor.

A gate of the second transistor is connected to the third node, a source thereof is connected to the idle output terminal, and a drain thereof is connected to the second level terminal.

A gate of the third transistor is connected to the first node, a source thereof is connected to the third node, and a drain thereof is connected to the second level terminal.

A gate of the fifth transistor is connected to the third node, a source thereof is connected to the first node, and drain thereof is connected to the second node.

A gate of the eighth transistor is connected to the third node, a source thereof is connected to the fourth node, and a drain thereof is connected to the third level terminal.

A gate of the tenth transistor is connected to the third node, a source thereof is connected to the output terminal, and a drain thereof is connected to the third level terminal.

A gate of the thirteenth transistor is connected to the third node, a source thereof is connected to the second node, and a drain thereof is connected to the second level terminal.

Optionally, the reset unit comprises: a twelfth transistor and a fifteenth transistor.

A gate of the twelfth transistor is connected to the reset terminal, a source thereof is connected to the first node, and a drain thereof is connected to the second node.

A gate of the fifteenth transistor is connected to the reset terminal, a source thereof is connected to the second node, and a drain thereof is connected to the second level terminal.

Optionally, the output unit comprises a ninth transistor, whose gate is connected to the first node, source is connected to the second clock signal terminal, and drain is connected to the output terminal.

Optionally, the first frame start signal is a single pulse signal, and the second frame start signal is a multi-pulse signal.

Or, the second frame start signal is a single pulse signal, and a pulse width of the second frame start signal comprises at least two clock cycles of a clock signal input to the first gate driving unit.

Optionally, the third frame start signal is a single pulse signal, and the fourth frame start signal is a multi-pulse signal.

Or, the fourth frame start signal is a single pulse signal, and a pulse width of the fourth frame start signal comprises at least two clock cycles of a clock signal input to the second gate driving unit.

Optionally, the fifth frame start signal is a multi-pulse signal, and the sixth frame start signal is a single pulse signal.

Or, the fifth frame start signal is a single pulse signal, and a pulse width of the fifth frame start signal comprises at least two clock cycles of a clock signal input to the first gate driving unit.

According to another aspect of the present disclosure, there is provided a driving method of a display circuit, comprising following steps:

inputting a first gate driving signal to a pixel unit by a first gate driving unit;

inputting a second gate driving signal to a pixel unit by a second gate driving unit; and controlling the pixel unit to perform threshold compensating and gray scale displaying simultaneously by the first gate driving signal and the second gate driving signal.

Optionally, the first gate driving signal and the second gate driving signal are multi-pulse signals.

Optionally, the first gate driving signal is a pulse signal comprising at least two kinds of pulse width, and/or the second gate driving signal is a pulse signal comprising at least two kinds of pulse width.

According to another aspect of the present disclosure, there is provided a display apparatus comprising the display circuit described above.

According to the embodiments of the present disclosure, the first gate driving signal is input to the pixel unit through the first gate driving unit, the second gate driving signal is input to the pixel unit through the second gate driving unit, and the pixel unit is controlled to perform threshold compensating and gray scale displaying simultaneously through the first gate driving signal and the second gate driving signal. Since threshold compensating and gray scale displaying of the pixel unit can be performed simultaneously under the control of signals of two gate driving units, the complexity in design of the display circuit can be reduced, which is advantageous for raising density of pixels of the display panel, so that resolution of the display panel is raised.

DETAILED DESCRIPTION

A display circuit and a driving method thereof an a display apparatus provided in embodiments of the present disclosure will be described below in detail by combining with accompanying figures, wherein same figure references are used to indicate same elements in the present disclosure. In the following description, a large amount of specific details are given for the purpose of explaining, so as to provide comprehensive understanding of one or more embodiments. However, obviously, the embodiments can also be implemented without these specific details.

Switching transistors and driving transistors adopted in all the embodiments of the present disclosure can be thin film transistors or field effect transistors or other devices having the same characteristics. Since a source and a drain of a switching transistor adopted herein are symmetrical, the sources and drain can be exchanged with each other. In the embodiments of the present disclosure, in order to distinguish the two electrodes other than a gate of a transistor, one electrode is called as a source, and the other electrode is called as a drain. According to forms in the figures, it is prescribed that a middle terminal of a switching transistor is a gate, a signal input terminal thereof is a drain, and an output terminal thereof is a source. In addition, the switching transistor adopted in the embodiments of the present disclosure comprises a P type switching transistor and a N type switching transistor, wherein the P type switching transistor is turned on when the gate is at a low level and is turned off when the gate is at a high level, while the N type switching transistor is turned on when the gate is at the high level and is turned off when the gate is at the low level; a driving transistor comprises a P type and a N type, wherein the P type driving transistor is in an amplified state or in a saturated state when a gate voltage is at the low level (the gate voltage is smaller than a source voltage) and an absolute of a voltage difference between the gate and the source is greater than a threshold voltage; wherein the N type driving transistor is in the amplified state or in the saturated state when a gate voltage is at the high level (the gate voltage is greater than a source voltage) and an absolute of a voltage difference between the gate and the source is greater than a threshold voltage.

Figure 1:
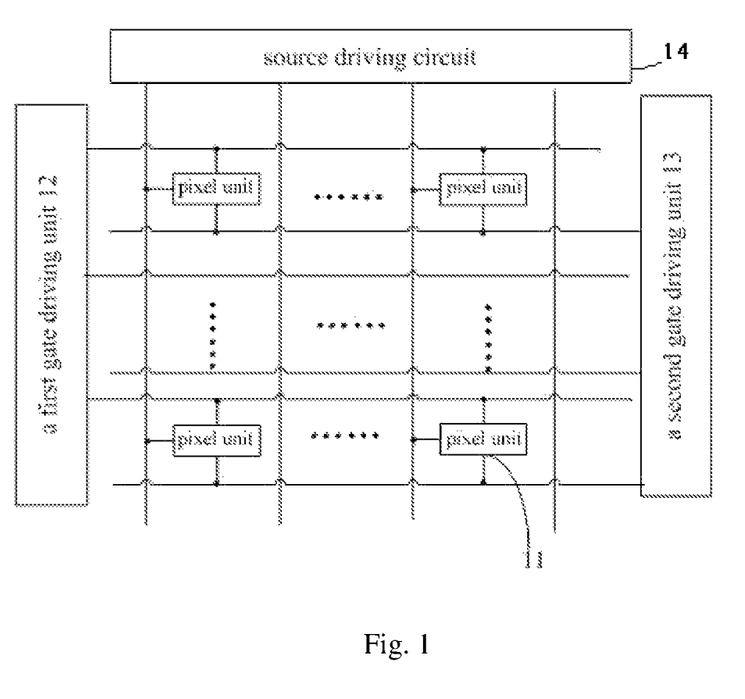
FIG. 1 is a schematic diagram of a configuration of a display circuit provided in an embodiment of the present disclosure.

FIG. 1 shows a schematic diagram of a configuration of a display circuit provided in an embodiment of the present disclosure. Referring to FIG. 1, the display circuit provided in the embodiment of the present disclosure comprises a pixel unit 11, a first gate driving unit 12 and a second gate driving unit 13.

In FIG. 1, the first gate driving unit 12 is configured to input a first gate driving signal to the pixel unit 11;

the second gate driving unit 13 is configured to input a second gate driving signal to the pixel unit 11; and the pixel unit 11 is configured to perform threshold compensating and gray scale displaying simultaneously under a control of the first gate driving signal and the second gate driving signal.

Herein, the pixel unit 11 is arranged in an array form generally. FIG. 1 also shows schematically a source driving circuit 14 that provides a data line signal. The pixel unit 11 can be any kind of pixel unit having a Vth compensating function. The embodiments of the present disclosure do not limit the specific circuit configuration of the pixel unit 11. The pixel unit 11 controls operation timing through at least two gate driving signals.

In the circuit of FIG. 1, the first gate driving signal is input to the pixel unit through the first gate driving unit, the second gate driving signal is input to the pixel unit through the second gate driving unit, and the pixel unit is controlled to perform threshold compensating and gray scale displaying simultaneously through the first gate driving signal and the second gate driving signal. Since threshold compensating and gray scale displaying of the pixel unit can be performed simultaneously under the control of the signals of two gate driving units, the complexity in design of the display circuit can be reduced, which is advantageous for raising density of pixels of the display panel, so that resolution of the display panel is raised.

Figure 2:
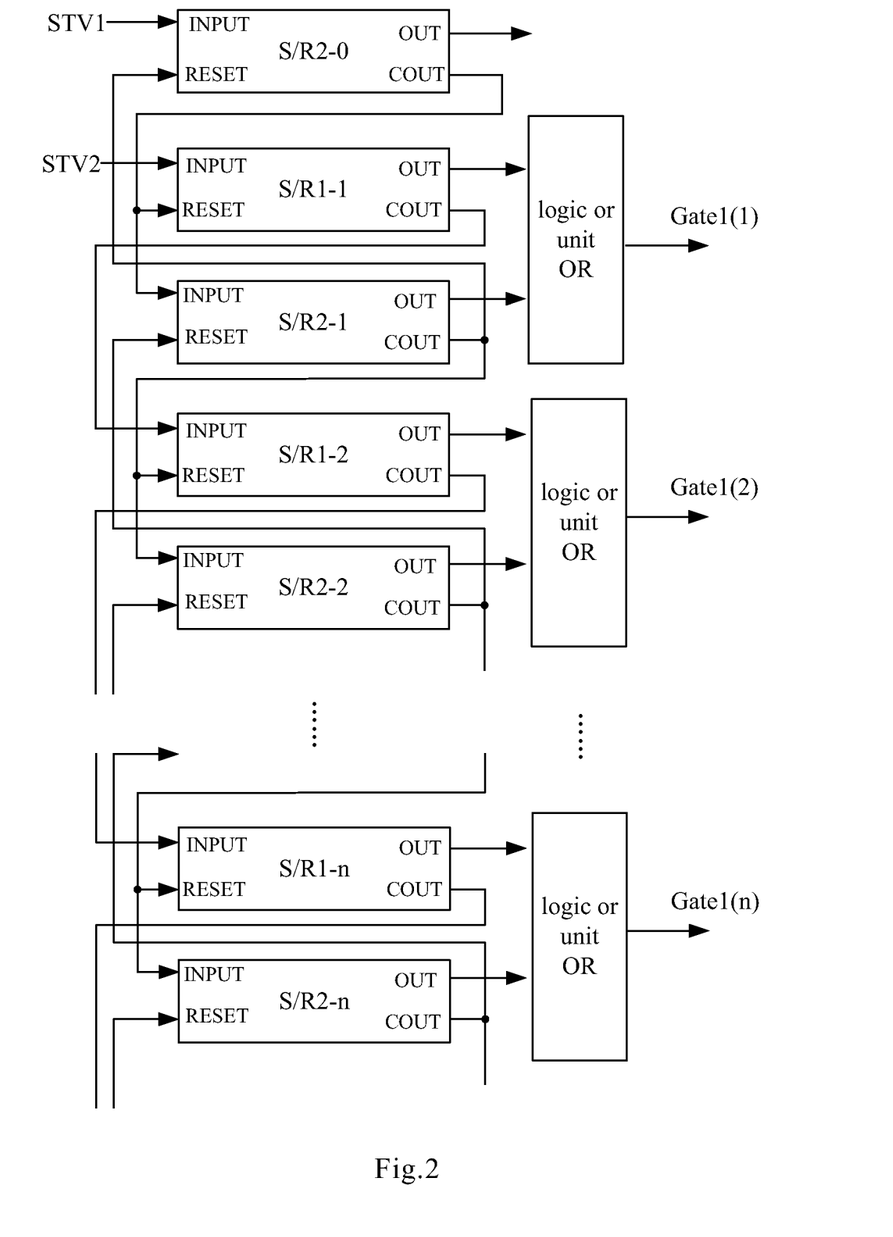
FIG. 2 is a schematic diagram of a configuration of a first gate driving unit provided in an embodiment of the present disclosure.

Further, FIG. 2 shows a schematic diagram of a configuration of a first gate driving unit provided in an embodiment of the present disclosure. As shown in FIG. 2, the first gate driving unit 12 comprises at least three GOA units, each of which comprises a signal input terminal INPUT, an output terminal OUT, a reset terminal RESET and an idle output terminal COUT.

In FIG. 2, the signal input terminal INPUT of a first stage of GOA unit (S/R2-0 as shown in FIG. 2) is input with a first frame start signal STV1, and the reset terminal thereof is connected to the idle output terminal COUT of a third stage of GOA unit;

the signal input terminal of a second stage of GOA unit (S/R1-1 as shown in FIG. 2) is input with a second frame start signal STV2;

the reset terminal RESET of a 2n-th stage of GOA unit is connected to the idle output terminal COUT of a (2n−1)-th stage of GOA unit and the signal input terminal INPUT of a (2n+1)-th stage of GOA unit;

the reset terminal RESET of the (2n+1)-th stage of GOA unit is connected to the idle output terminal COUT of a (2n+3)-th stage of GOA unit;

the signal input terminal INPUT of a (2n+2)-th stage of GOA unit is connected to the idle output terminal COUT of a 2n-th stage of GOA unit;

the output unit OUT of the 2n-th stage of GOA unit and the output terminal OUT of the (2n+1)-th stage of GOA unit output the first gate driving signal to a pixel unit in a n-th row through a logic or unit OR, where n is a positive integer.

Herein, it can be understood that the logic or unit OR is capable of superimposing signals of the output terminal OUT of the 2n-th stage of GOA unit and the output terminal OUT of the (2n+1)-th stage of GOA unit in time domain and outputting them.

Figure 3:
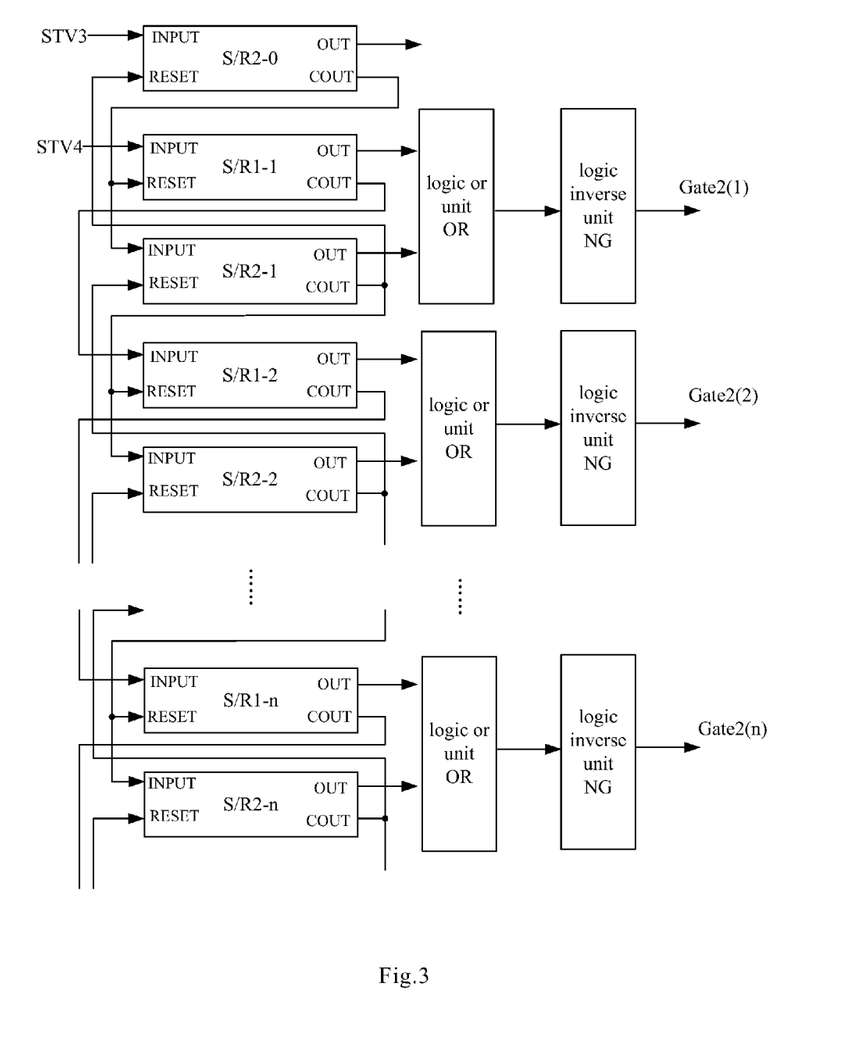
FIG. 3 is a schematic diagram of a configuration of a second gate driving unit provided in an embodiment of the present disclosure.
Figure 4:
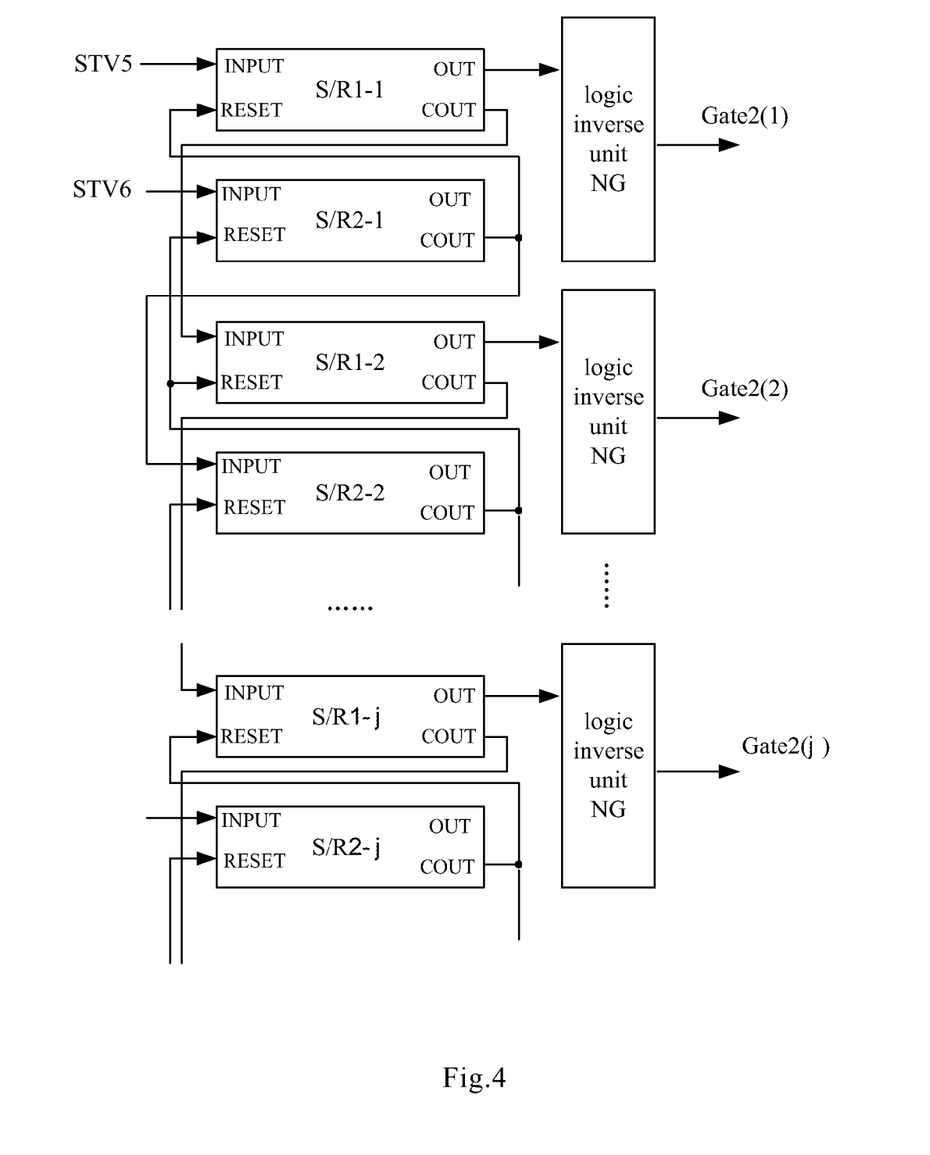
FIG. 4 is a schematic diagram of a configuration of a second gate driving unit provided in another embodiment of the present disclosure.

Further, FIG. 3 shows a schematic diagram of a configuration of a second gate driving unit provided in an embodiment of the present disclosure. FIG. 4 shows a schematic diagram of a configuration of a second gate driving unit provided in another embodiment of the present disclosure. The second gate driving unit can be implemented by any one of the two modes provided in FIG. 3 or FIG. 4. As shown in FIG. 3, the second gate driving unit 13 comprises at least three GOA units, each of which comprises a signal input terminal, an output terminal, a reset terminal and an idle output terminal;

In FIG. 3, the signal input terminal of a first stage of GOA unit (S/R2-0) is input with a third frame start signal, and the reset terminal thereof is connected to the idle output terminal of a third stage of GOA unit (S/R2-1);

the signal input terminal of a second stage of GOA unit (S/R1-1) is input a fourth frame start signal;

the reset terminal of a 2n-th stage of GOA unit is connected to the idle output terminal of a (2n−1)-th stage of GOA unit and the signal input terminal of a (2n+1)-th stage of GOA unit.

the reset terminal of the (2n+1)-th stage of GOA unit is connected to the idle output terminal of a (2n+3)-th stage of GOA unit;

the signal input terminal of a (2n+2)-th stage of GOA unit is connected to the idle output terminal of a 2n-th stage of GOA unit.

the output terminal of the 2n-th stage of GOA unit and the output terminal of the (2n+1)-th stage of GOA unit are connected to an input terminal of a logic or unit, an output terminal of the logic or unit is connected to an input terminal of a logic inverse unit, and an output terminal of the logic inverse unit outputs the second gate driving signal, where n is a positive integer.

It can be understood that the logic inverse unit NG is capable of inversing a signal of the input terminal of the logic or unit OR 180° and then outputting the same.

As shown in FIG. 4, the second gate driving unit 13 comprises at least a pair of GOA units, each of which comprises a signal input terminal INPUT, an output terminal OUT, a reset terminal RESET and an idle output terminal COUT.

Except for the first stage of GOA unit and the second stage of GOA unit, the signal input terminal INPUT of a m-th stage of GOA unit is connected to the idle output terminal COUT of a (m−2)-th stage of GOA unit; the reset terminal RESET of the m-th stage of GOA unit is connected to the idle output terminal COUT of a (m+1)-th stage of GOA unit; the signal input terminal INPUT of a (m+1)-th stage of GOA unit is connected to the idle output terminal COUT of a (m−1)-th stage of GOA unit; and the reset terminal RESET of the (m+1)-th stage of GOA unit is connected to the idle output terminal COUT of a (m+3)-th stage of GOA unit.

The reset terminal RESET of the first stage of GOA unit is connected to the idle output terminal COUT of the second stage of GOA unit; the reset terminal RESET of the second stage of GOA unit is connected to the idle output terminal COUT of a fourth stage of GOA unit.

Herein, the signal input terminal INPUT of the first stage of GOA unit is input with a fifth frame start signal, and the signal input terminal INPUT of the second stage of GOA unit is input with a sixth frame start signal;

the output terminal of the m-th stage of GOA unit outputs the second gate driving signal to a pixel unit in a (m+1)/2-th row through the logic inverse unit, where m is an odd number.

It can be understood that the logic inverse unit NG is capable of inversing a signal of the input terminal of the logic or unit OR 180° and then outputting the same.

Figure 5:
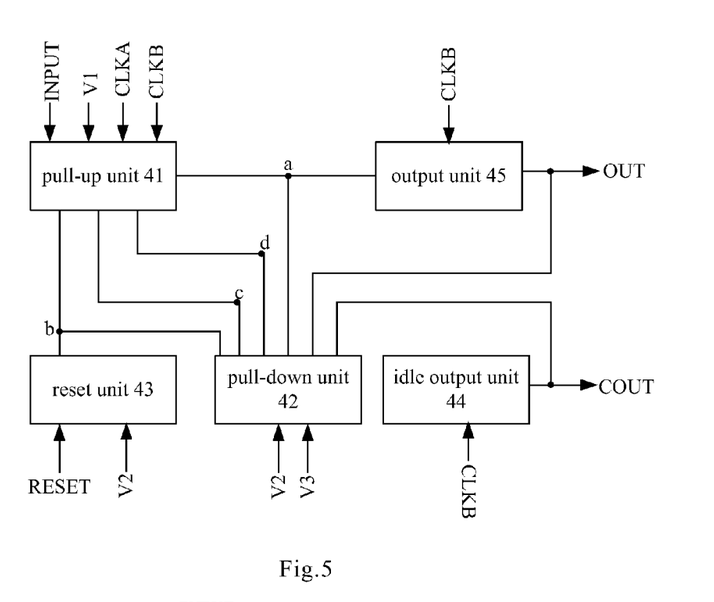
FIG. 5 is a schematic diagram of a configuration of a GOA unit provided in an embodiment of the present disclosure.

FIG. 5 shows a schematic diagram of a configuration of a GOA unit provided in an embodiment of the present disclosure. Optionally, as shown in FIG. 5, the GOA unit comprises: a pull-up unit 41, a pull-down unit 42, a reset unit 43, an idle output unit 44 and an output unit 45.

In FIG. 5, the pull-up unit 41 is connected to the signal input terminal INPUT, a first level terminal V1, a first clock signal terminal CLKA, a second clock signal terminal CLKB, first node a, second node b, third node c and fourth node d. The pull-up unit 41 is configured to make a voltage of the first node a consistent with the signal input terminal INPUT, make a voltage of the second node b consistent with the signal input terminal INPUT or make the voltage of the second node b consistent with a voltage of the fourth node d, make a voltage of the third node c consistent with a voltage of the first level terminal V1, and make the voltage of the fourth node d consistent with a voltage of the first clock signal terminal CLKA under the control of signals of the signal input terminal INPUT, the first level terminal V1, the first clock signal terminal CLKA and the second clock signal terminal CLKB.

In FIG. 5, the pull-down unit 42 is connected to a second level terminal V2, a third level terminal V3, the idle output terminal COUT, the output terminal OUT, the first node a, the second node b, the third node c and the fourth node d. The pull-down unit 42 is configured to make the voltage of the third node c consistent with the second level terminal V2 under the control of a signal of the first node a, make voltages of the first node a and the second node b consistent with the second level terminal uniform V2 under the control of a signal of the third node c, make a voltage of the output terminal OUT consistent with the second level terminal V2 under the control of the signal of the third node c, make a voltage of the output terminal OUT consistent with the third level terminal V3 under the control of the signal of the third node c, and make a voltage of the fourth node d consistent with the third level terminal V3 under the control of the signal of the third node c.

As shown in FIG. 5, the reset unit 43 is connected to the reset terminal RESET, the second level terminal V2, the second node b, and is connected to the first node a through the pull-down unit 42; and is configured to make the voltages of the first node a and the second node b consistent with the second level terminal V2 under the control of a signal of the reset terminal RESET.

As shown in FIG. 5, the idle output terminal 44 is connected to the second clock signal terminal CLKB and the idle output terminal COUT, and is connected to the first node a through the pull-down unit 42; and is configured to output a signal of the second clock signal terminal CLKB at the idle output terminal COUT under the control of the first node a.

As shown in FIG. 5, the output unit 45 is connected to the first node a, the second clock signal terminal CLKB and the output terminal OUT. The output unit 45 is configured to output the signal of the second clock signal terminal CLKB at the output terminal OUT under the control of the first node a.

Figure 6:
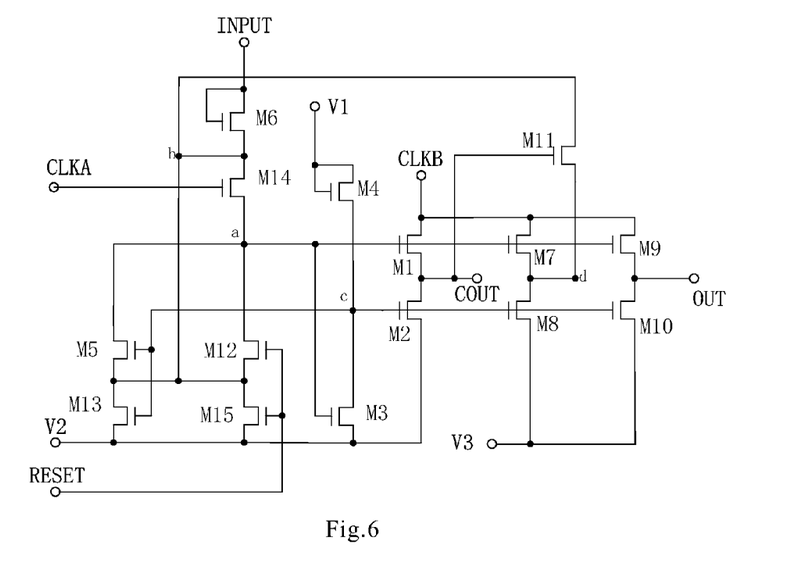
FIG. 6 is a schematic diagram of a configuration of a GOA unit provided in another embodiment of the present disclosure.

FIG. 6 shows a schematic diagram of a configuration of a GOA unit provided in another embodiment of the present disclosure. Further, as shown in FIG. 6, in the GOA unit, the idle output unit comprises: a first transistor M1, whose gate is connected to the first node a, source is connected to the second clock signal terminal CLKB, and drain is connected to the idle output terminal COUT.

As shown in FIG. 6, the pull-up unit comprises: a fourth transistor M4, a sixth transistor M6, a seventh transistor M7, an eleventh transistor M11, and a fourteenth transistor M14.

A gate and a source of the fourth transistor M4 are connected to the first level terminal V1, and a drain thereof is connected to the third node c.

A gate and a source of the sixth transistor M6 are connected to the signal input terminal INPUT, and a drain thereof is connected to the second node b.

A gate of the seventh transistor M7 is connected to the first node a, a source thereof is connected to the second clock signal terminal CLKB, and a drain thereof is connected to the fourth node d.

A gate of the eleventh transistor M11 is connected to the idle output terminal COUT, a source thereof is connected to the second node b, and a drain thereof is connected to the fourth node d.

A gate of the fourteenth transistor M14 is connected to the first clock signal terminal CLKA, a source thereof is connected to the second node b, and a drain thereof is connected to the first node a.

As shown in FIG. 6, the pull-down unit comprises: a second transistor M2, a third transistor M3, a fifth transistor M5, an eighth transistor M8, a tenth transistor M10 and a thirteenth transistor M13.

A gate of the second transistor M2 is connected to the third node c, a source thereof is connected to the idle output terminal COUT, and a drain thereof is connected to the second level terminal V2.

A gate of the third transistor M3 is connected to the first node a, a source thereof is connected to the third node c, and a drain thereof is connected to the second level terminal V2.

A gate of the fifth transistor M5 is connected to the third node c, a source thereof is connected to the first node a, and drain thereof is connected to the second node b.

A gate of the eighth transistor M8 is connected to the third node c, a source thereof is connected to the fourth node d, and a drain thereof is connected to the third level terminal V3.

A gate of the tenth transistor M10 is connected to the third node c, a source thereof is connected to the output terminal OUT, and a drain thereof is connected to the third level terminal V3.

A gate of the thirteenth transistor M13 is connected to the third node c, a source thereof is connected to the second node b, and a drain thereof is connected to the second level terminal V2.

As shown in FIG. 6, the reset unit comprises: a twelfth transistor M12 and a fifteenth transistor M15.

A gate of the twelfth transistor M12 is connected to the reset terminal RESET, a source thereof is connected to the first node a, and a drain thereof is connected to the second node b.

A gate of the fifteenth transistor M15 is connected to the reset terminal RESET, a source thereof is connected to the second node b, and a drain thereof is connected to the second level terminal V2.

As shown in FIG. 6, the output unit comprises a ninth transistor M9, whose gate is connected to the first node a, source is connected to the second clock signal terminal CLKB, and drain is connected to the output terminal OUT.

Further, optionally, the first frame start signal is a single pulse signal, and the second frame start signal is a multi-pulse signal. Or, the second frame start signal is a single pulse signal, and a pulse width of the second frame start signal comprises at least two clock cycles of a clock signal input to the first gate driving unit. The third frame start signal is a single pulse signal, and the fourth frame start signal is a multi-pulse signal. Or, the fourth frame start signal is a single pulse signal, and a pulse width of the fourth frame start signal comprises at least two clock cycles of a clock signal input to the second gate driving unit. The fifth frame start signal is a multi-pulse signal, and the sixth frame start signal is a single pulse signal. Or, the fifth frame start signal is a single pulse signal, and a pulse width of the fifth frame start signal comprises at least two clock cycles of a clock signal input to the first gate driving unit.

The pixel unit 11 applied in the embodiment of the present disclosure can be any kind of pixel unit having the Vth compensating function, and the pixel unit 11 controls its operation timing through at least two gate driving signals. The specific circuit structure of the pixel unit 11 is not provided herein.

The operating process of the display circuit will be described below by referring to the schematic diagrams of timing signals as shown in FIGS. 7, 8, 9, and 10. Herein, the respective transistors in the GOA unit can be N type switching transistors or P type switching transistors. The description below takes the N type switching transistors as an example. In addition, the signal of the first level terminal V1 is a high level VGH, the signal of the second level terminal V2 is a first low level VGL1, and the signal of the third level terminal V3 is a second low level VGL2. As shown in FIG. 2, for the GOA unit in the first gate driving unit 12, the first clock signal terminal CLKA of the odd number stage of GOA units (such as S/R2-0, S/R2-1 in FIG. 2) is input with a first clock signal CLK1, the second clock signal terminal CLKB thereof is input with a second clock signal CLK2, and the signal input terminal INPUT of the first stage of GOA unit is input with a first frame start signal STV1; wherein CLK1 and CLK2 are a pair of clock signals having inverse phases, that is, CLK1 and CLK2 has a phase difference of 180°. For example, CLK1 and CLK2 have the same duty ratio (for example, their duty ratio is 50%), have the same frequency, and have a phase difference of 180°. A clock signal input to the first clock signal terminal CLKA of one GOA unit of two adjacent odd number stage of GOA units has a phase inverse to a clock signal input to the first clock signal terminal CLKA of another GOA unit of the two adjacent odd number stage of GOA units (i.e., having a phase difference of 180°). In the even number stage of GOA unit (such as S/R1-1, S/R1-2 in FIG. 2), the first clock signal terminal CLKA of the GOA unit S/R1-2$x$ is input with a third clock signal CLK3, the second clock signal terminal CLKB thereof is input with a fourth clock signal CLK4, the first clock signal terminal CLKA of the GOA unit S/R1-(2$x$-1) is input with a fifth clock signal CLK5, and the second clock signal terminal CLKB thereof is input with a sixth clock signal CLK6; the signal input terminal INPUT of the second stage of GOA unit (S/R1-1) is input with a second frame start signal STV2; CLK3 and CLK4 are a pair of clock signals having inverse phases, that is, CLK3 and CLK4 has a phase difference of 180°. For example, CLK3 and CLK4 have the same duty ratio (for example, their duty ratio is 50%), have the same frequency, and have a phase difference of 180°. CLK5 and CLK6 are a pair of clock signals having inverse phases, that is, CLK5 and CLK6 has a phase difference of 180°. For example, CLK5 and CLK6 have the same duty ratio (for example, their duty ratio is 50%), have the same frequency, and have a phase difference of 180°. CLK3 and CLK5 have a preset phase difference. Exemplarily, CLK3 and CLK5 have a phase difference of 90° or 180°, or a pulse rising edge of CLK5 delays a quarter of cycle or a half of cycle than a pulse rising edge of CLK3. The frequency of CLK3 is different from that of CLK1, for example, the frequency of CLK3 is greater than that of CLK1, that is, the pulse width of CLK3 is smaller than that of CLK1; the frequency of CLK5 is greater than that of CLK1, that is, the pulse width of CLK5 is smaller than that of CLK1. Exemplarily, the pulse width of CLK3 is 50% of the pulse width of CLK1; the pulse width of CLK5 is 50% of the pulse width of CLK1.

Figure 7:
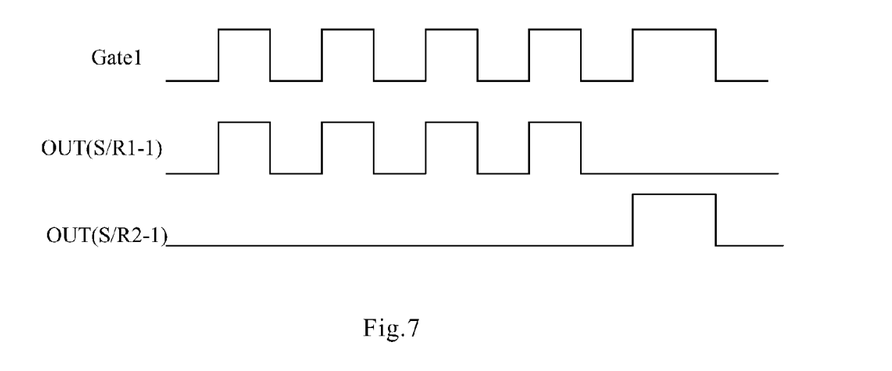
FIG. 7 is a schematic diagram of a timing signal provided in an embodiment of the present disclosure.
Figure 8:
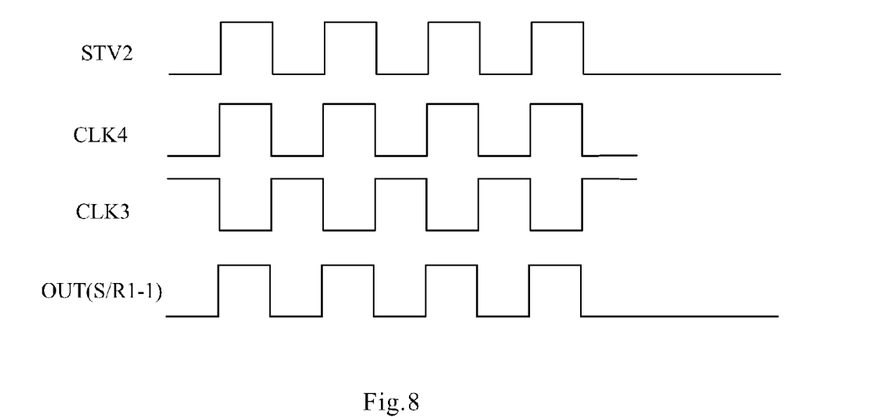
FIG. 8 is a schematic diagram of another timing signal provided in an embodiment of the present disclosure.
Figure 9:
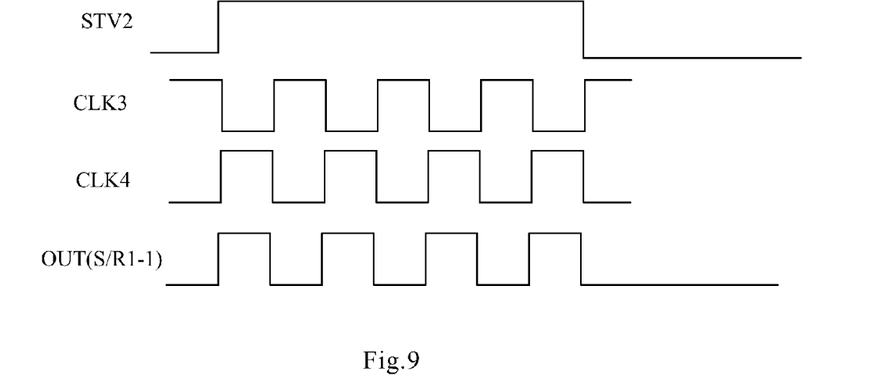
FIG. 9 is a schematic diagram of yet another timing signal provided in an embodiment of the present disclosure.

In FIG. 2, for the odd number stage of GOA units in the first gate driving unit 12, in the output process of the present stage, the respective transistors in the pull-up unit 41 are in a turn-on state, and the respective transistors in the pull-down unit 42 is in a turn-off state; the respective transistors in the reset unit 43 is in the turn-off state, and the respective transistors in the output unit 45 and the idle output unit 44 are in the turn-on state. As shown in FIG. 7, the output terminal of the second stage of GOA unit (S/R1-1) outputs a multi-pulse signal. As shown in FIG. 8, there is provided a specific implementing mode of the multi-pulse signal. The second frame start signal STV2 is a multi-pulse signal. Alternatively, as shown in FIG. 9, the pulse width of the second frame start signal STV2 is adjusted so that the pulse width of STV2 comprises at least two clock cycles of the clock signal CLK4 input to the first gate driving unit, that is, CLK4 comprises four pulse signals in the duration of one pulse width of STV2. In view of FIG. 9, if the respective transistors are turned on at the high level, within a period of time of one high level pulse of STV2, when CLK4 is at the high level, the output unit is capable of taking the signal of CLK4 as the output signal of the second stage of GOA unit (S/R1-1). Since CLK4 comprises four pulse signals in the duration of one pulse width of STV2, the signal output from the output terminal of the second stage of GOA unit (S/R1-1) is the multi-pulse signal comprising four pulses. For the subsequent 2n-th stage of GOA unit, since the signal output from the COUT terminal of the (2n−2)-th stage of GOA unit is the multi-pulse signal, the input terminal INPUT of the 2n-th stage of GOA unit is also the multi-pulse signal (that is, a carry signal is also the multi-pulse signal). Therefore, the output terminal OUT of the 2n-th stage of GOA unit obtains the output of the multi-pulse signal too.

In the non-output process of the present stage, the respective transistors of the pull-up unit 41 are in the turn-off state, and the respective transistors in the pull-down unit 42 are in the turn-on state. The respective transistors in the reset unit 43 are in the turn-on state, and the respective transistors in the output unit 45 and the idle output unit 44 are in the turn-off state. At this time, the OUT terminal of the output unit 45 does not output, and the COUT terminal of the idle output terminal 44 does not output either.

For the odd number stage of GOA units in the first gate driving unit 12, in the output process of the present stage, the respective transistors in the pull-up unit 41 are in the turn-on state, and the respective transistors in the pull-down unit 42 are in the turn-off state; the respective transistors in the reset unit 43 are in the turn-off state, and the respective transistors in the output unit 45 and the idle output unit 44 are in the turn-on state. Exemplarily, as shown in FIG. 7, the output terminal of the third stage of GOA unit (S/R2-1) outputs a single pulse signal, and thus the odd number stage of GOA unit sequence in the first gate driving unit 12 outputs the single pulse signal, which is a conventional mode, and thus is not described in detail in the embodiment of the present disclosure by combing with the timing diagrams of STV1, CLK1 and CLK2. In the non-output process of the present stage, the respective transistors in the pull-up unit 41 are in the turn-off state, and the respective transistors in the pull-down unit 42 are in the turn-on state; the respective transistors in the reset unit 43 are in the turn-on state, and the respective transistors in the output unit 45 and the idle output unit 44 are in the turn-off state. At this time, the OUT terminal of the output unit 45 does not output, and the COUT terminal of the idle output unit 44 does not output either.

The output signal of the 2n-th stage of GOA unit and the output signal of the (2n+1)-th stage of GOA unit are superimposed by the logic or unit OR and output to obtain a gate driving signal Gate1($n$) of the pixel unit in the n-th row. As shown in FIG. 7, the multi-pulse signal comprising four pulses, output from the output terminal of the second stage of GOA unit (S/R1-1) and the signal pulse signal output from the output terminal of the third stage of GOA unit (S/R2-1) are superimposed and output to obtain Gate1. Since the pulse width of CLK3 is smaller than that of CLK1 and the pulse width of CLK5 is smaller than that of CLK1, Gate1 comprises one wide pulse signal and at least one narrow pulse signal with a fixed waveform. Herein, in FIGS. 6-10, Gate1 comprising one wide pulse signal and four narrow pulse signals with a fixed waveform is just an example. The embodiment of the present disclose is not limited thereto, and there may be a combination of other forms.

For the operation principle of the second gate driving unit 13 as shown in FIG. 3, with respect to the first gate driving unit 12 as shown in FIG. 2, since only a logic inverse unit is added in the second gate driving unit 13 as shown in FIG. 3, the first gate driving signal output by the first gate driving unit 12 as shown in FIG. 2 is only inversed a phase of 180°, and then used as the second gate driving signal. Herein, in the two frame start signals, the fifth frame start signal STV5 is similar to the third frame start signal STV3, and the sixth frame start signal STV6 is similar to the fourth frame start signal STV4. The specific principle is not further given herein.

For the GOA units in the second gate driving unit 13 as shown in FIG. 4, the first clock signal terminal CLKA of the odd number stage of GOA units is input with a seventh clock signal CLK7, and the second clock signal terminal CLKB thereof is input with an eighth clock signal CLK8, and the signal input terminal INPUT of the first state of GOA unit is input with a fifth frame start signal STV5. Herein, CLK7 and CLK8 are a pair of clock signals having inverse phases, that is, CLK7 and CLK8 have a phase difference of 180°. For example, CLK7 and CLK8 have the same duty ratio (for example, their duty ratio is 50%), have the same frequency, and have a phase difference of 180°. The clock signal input to the first clock signal terminal CLKA of one GOA unit of two adjacent odd number stage of GOA units has a phase inverse to the clock signal input to the first clock signal terminal CLKA of another GOA unit of the two adjacent odd number stage of GOA units (i.e., having a phase difference of 180°). The first clock signal terminal CLKA of the even number stage of GOA unit is input with a ninth clock signal CLK9, the second clock signal terminal CLKB thereof is input with a tenth clock signal CLK10, and the input terminal INPUT of the second stage of GOA unit is input with a sixth frame start signal STV6. Herein, CLK9 and CLK10 are a pair of clock signals having inverse phases, that is, CLK9 and CLK10 have a phase difference of 180°. For example, CLK9 and CLK10 have the same duty ratio (for example, their duty ratio is 50%), have the same frequency, and have a phase difference of 180°. The clock signal input to the first clock signal terminal CLKA of one GOA unit of two adjacent even number stage of GOA units has a phase inverse to the clock signal input to the first clock signal terminal CLKA of another GOA unit of the two adjacent odd number stage of GOA units (i.e., having a phase difference of 180°).

Figure 10:
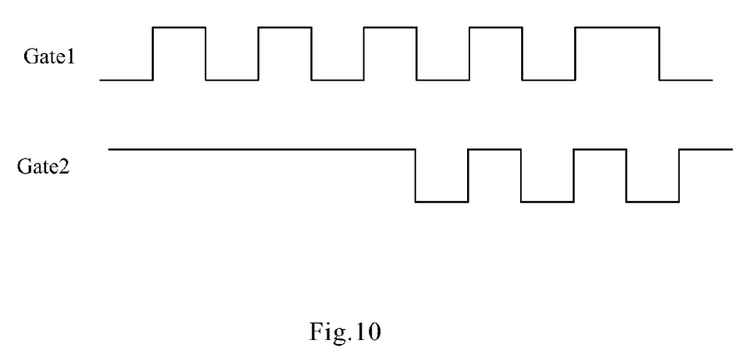
FIG. 10 is a schematic diagram of another timing signal provided in an embodiment of the present disclosure.

In addition, as shown in FIG. 10, for the odd number stage of GOA units in the second gate driving unit 13, in the output process of the present stage, the respective transistors in the pull-up unit 41 are in a turn-on state, and the respective transistors in the pull-down unit 42 is in a turn-off state; the respective transistors in the reset unit 43 is in the turn-off state, and the respective transistors in the output unit 45 and the idle output unit 44 are in the turn-on state. Similar to the even number state of GOA units in the first gate driving unit 12, the odd number stage of GOA units in the second gate driving unit 13 outputs a multi-pulse signal, which is used as a gate driving signal Gate2 of the pixel unit in the (m+1)/2-th row after a process of inversing a phase of 180° by the logic inverse unit NG, where m is an odd number. In the non-output process of the present stage, the respective transistors of the pull-up unit 41 are in the turn-off state, and the respective transistors in the pull-down unit 42 are in the turn-on state. The respective transistors in the reset unit 43 are in the turn-on state, and the respective transistors in the output unit 45 and the idle output unit 44 are in the turn-off state. At this time, the OUT terminal of the output unit 45 does not output, and the COUT terminal of the idle output terminal 44 does not output either.

For the odd number stage of GOA units in the second gate driving unit 13, in the output process of the present stage, the respective transistors in the pull-up unit 41 are in the turn-on state, and the respective transistors in the pull-down unit 42 are in the turn-off state; the respective transistors in the reset unit 43 are in the turn-off state, and the respective transistors in the output unit 45 and the idle output unit 44 are in the turn-on state. The even number stages of GOA units in the second gate driving unit 13 provide the reset signal input by the reset terminal RESET to the adjacent previous even number stage of GOA unit through the COUT terminal, and this reset signal can be a single pulse signal. The third state of GOA unit (S/R2-1) is similar to the odd number stage of GOA units in the first gate driving unit 12, and thus no further description is given herein. In the non-output process of the present stage, the respective transistors in the pull-up unit 41 are in the turn-off state, and the respective transistors in the pull-down unit 42 are in the turn-on state; the respective transistors in the reset unit 43 are in the turn-on state, and the respective transistors in the output unit 45 and the idle output unit 44 are in the turn-off state. At this time, the OUT terminal of the output unit 45 does not output, and the COUT terminal of the idle output unit 44 does not output either.

Of course, the timing states of the first gate driving signal generated by the first gate driving unit 12 and the second gate driving signal generated by the second gate driving unit 13 provided in FIGS. 7, 8, 9 and 10 are just a possible implementation form. When the clock signal and the frame start signal input to the GOA unit are adjusted, the first gate driving signal and the second gate driving signal in other timing states may be also generated to be output, to which no specific limitation is made.

Figure 11:
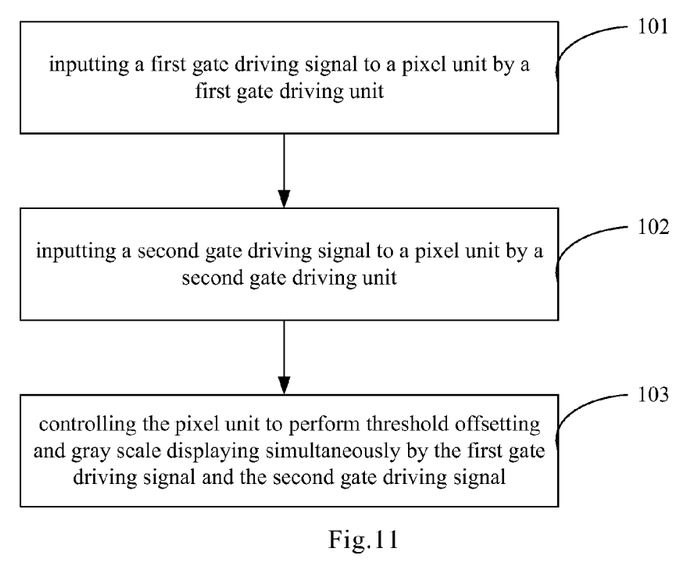
FIG. 11 is a flow schematic diagram of a driving method of a display circuit provided in an embodiment of the present disclosure.

FIG. 11 is a flow schematic diagram of a driving method of a display circuit provided in an embodiment of the present disclosure. As shown in FIG. 11, there is provided a driving method of a display circuit in the embodiment of the present disclosure, comprising following steps:

in step 101, a first gate driving signal is input to a pixel unit through a first gate driving unit;

in step 102, a second gate driving signal is input to a pixel unit through a second gate driving unit; and in step 103, the pixel unit is controlled by the first gate driving signal and the second gate driving signal to perform threshold compensating and gray scale displaying simultaneously.

Optionally, the first gate driving signal and the second gate driving signal are multi-pulse signals. Optionally, the first gate driving signal is a pulse signal comprising at least two kinds of pulse width, and/or the second gate driving signal is a pulse signal comprising at least two kinds of pulse width.

In the embodiments described above, the first gate driving signal is input to the pixel unit through the first gate driving unit, the second gate driving signal is input to the pixel unit through the second gate driving unit, and the pixel unit is controlled by the first gate driving signal and the second gate driving signal to perform threshold compensating and gray scale displaying simultaneously. Since threshold compensating and gray scale displaying of the pixel unit can be performed simultaneously under the control of signals of two gate driving units, the complexity in design of the display circuit can be reduced, which is advantageous for raising density of pixels of the display panel, so that resolution of the display panel is raised.

There is further provided in an embodiment of the present disclosure a display apparatus, comprising any one of the display circuits described above, wherein the display circuit comprises a pixel unit, a first gate driving unit and a second gate driving unit. The display apparatus can be a display device such as an electronic paper, a mobile phone, a TV set, a digital photo frame, etc.

The above descriptions are just specific implementations of the present disclosure. The protection scope of the present disclosure is not limited thereto. Any alternation or replacement that can be easily conceivable for those skilled in the art who are familiar with the technical field within the technical scope disclosed by the present disclosure shall fall into the protection scope of the present disclosure. Therefore, the protection scope of the present disclosure shall be subjected to the protection scope of the claims.

The present application claims the priority of a Chinese patent application No. 201410554799.9 filed on Oct. 17, 2014. Herein, the content disclosed by the Chinese patent application is incorporated in full by reference as a part of the present disclosure.

What is claimed is:

1. A display circuit comprising a pixel unit, a first gate driving circuit and a second gate driving circuit;
    wherein the first gate driving circuit is configured to input a first gate driving signal to the pixel unit;
    the second gate driving circuit is configured to input a second gate driving signal to the pixel unit; and
    the pixel unit is configured to perform threshold compensating and gray scale displaying simultaneously under the control of the first gate driving signal and the second gate driving signal;
    wherein either of the first gate driving circuit and the second gate driving circuit comprises at least three gate driver on array (GOA) units, each GOA unit comprising a signal input terminal, an output terminal, a reset terminal and an idle output terminal, and wherein GOA units at both 2n-th and (2n+1)-th stages in the first gate driving circuit output the first gate driving signal to a pixel unit in a n-th row through a first logic or unit, and GOA units at both 2n-th and (2n+1)-th stages in the second gate driving circuit output the second gate driving signal to the pixel unit in the n-th row through a second logic or unit and a logic inverse unit connected in series, n being a positive integer.

2. The display circuit according to claim 1, wherein, in the first gate driving circuit,
    a signal input terminal of a first stage of GOA unit is input with a first frame start signal, and a reset terminal thereof is connected to an idle output terminal of a third stage of GOA unit;
    a signal input terminal of a second stage of GOA unit is input with a second frame start signal;
    a reset terminal of a 2n-th stage of GOA unit is connected to an idle output terminal of a (2n−1)-th stage of GOA unit and a signal input terminal of a (2n+1)-th stage of GOA unit;
    a reset terminal of the (2n+1)-th stage of GOA unit is connected to an idle output terminal of a (2n+3)-th stage of GOA unit;
    a signal input terminal of a (2n+2)-th stage of GOA unit is connected to an idle output terminal of a 2n-th stage of GOA unit.

3. The display circuit according to claim 2, wherein the first frame start signal is a single pulse signal, and the second frame start signal is a multi-pulse signal; or
    the second frame start signal is a single pulse signal, and a pulse width of the second frame start signal comprises at least two clock cycles of a clock signal input to the first gate driving circuit.

4. The display circuit according to claim 1, wherein, in the second gate driving circuit,
    a signal input terminal of a first stage of GOA unit is input with a first frame start signal, and a reset terminal thereof is connected to an idle output terminal of a third stage of GOA unit;
    a signal input terminal of a second stage of GOA unit is input with a second frame start signal;
    a reset terminal of a 2n-th stage of GOA unit is connected to an idle output terminal of a (2n−1)-th stage of GOA unit and a signal input terminal of a (2n+1)-th stage of GOA unit;
    a reset terminal of the (2n+1)-th stage of GOA unit is connected to an idle output terminal of a (2n+3)-th stage of GOA unit;
    a signal input terminal of a (2n+2)-th stage of GOA unit is connected to an idle output terminal of a 2n-th stage of GOA unit; and
    an output terminal of the 2n-th stage of GOA unit and an output terminal of the (2n+1)-th stage of GOA unit are connected to an input terminal of the second logic or unit, an output terminal of the second logic or unit is connected to an input terminal of the logic inverse unit.

5. The display circuit according to claim 4, wherein the first frame start signal is a single pulse signal, and the second frame start signal is a multi-pulse signal; or
    the second frame start signal is a single pulse signal, and a pulse width of the second frame start signal comprises at least two clock cycles of a clock signal input to the second gate driving circuit.

6. The display circuit according to claim 1, wherein in the second gate driving circuit,
    except for the first stage of GOA unit and the second stage of GOA unit, a signal input terminal of a m-th stage of GOA unit is connected to an idle output terminal of a (m−2)-th stage of GOA unit; a reset terminal of the m-th stage of GOA unit is connected to an idle output terminal of a (m+1)-th stage of GOA unit; a signal input terminal of a (m+1)-th stage of GOA unit is connected to an idle output terminal of a (m−1)-th stage of GOA unit; and a reset terminal of the (m+1)-th stage of GOA unit is connected to an idle output terminal of a (m+3)-th stage of GOA unit;
    a reset terminal of the first stage of GOA unit is connected to an idle output terminal of the second stage of GOA unit; a reset terminal of the second stage of GOA unit is connected to the idle output terminal of a fourth stage of GOA unit;
    a signal input terminal of the first stage of GOA unit is input with a first frame start signal, and a signal input terminal of the second stage of GOA unit is input with a second frame start signal; and
    an output terminal of the m-th stage of GOA unit outputs the second gate driving signal to a pixel unit in a (m+1)/2-th row through the logic inverse unit, where m is an odd number.

7. The display circuit according to claim 6, wherein the first frame start signal is a multi-pulse signal and the second frame start signal is a single pulse signal;

or the first frame start signal is a single pulse signal, and a pulse width of the first frame start signal comprises at least two clock cycles of a clock signal input to the first gate driving circuit.

8. The display circuit according to claim 6, wherein each GOA unit comprises: a pull-up sub-circuit, a pull-down sub-circuit, a reset sub-circuit, an idle output sub-circuit and an output sub-circuit;

the pull-up sub-circuit is connected to the signal input terminal, a first level terminal, a first clock signal terminal, a second clock signal terminal, a first node, a second node, a third node and a fourth node, and is configured to make a voltage of the first node consistent with the signal input terminal, make a voltage of the second node consistent with the signal input terminal or make the voltage of the second node consistent with a voltage of the fourth node, make a voltage of the third node consistent with a voltage of the first level terminal, and make the voltage of the fourth node consistent with a voltage of the first clock signal terminal under the control of signals of the signal input terminal, the first level terminal, the first clock signal terminal and the second clock signal terminal, wherein the pull-up sub-circuit comprises a first transistor connected between the first level terminal and the third node, a second transistor connected between the signal input terminal and the second node, a third transistor connected between the second clock signal terminal and the fourth node, and a fourth transistor connected between the first clock signal terminal and the first node;

the pull-down sub-circuit is connected to a second level terminal, a third level terminal, the idle output terminal, the output terminal, the first node, the second node, the third node and the fourth node, and is configured to make a voltage of the third node consistent with the second level terminal under the control of a signal of the first node, make voltages of the first node consistent with the second node and the second level terminal under the control of a signal of the third node, make a voltage of the output terminal consistent with the second level terminal under the control of the signal of the third node, make a voltage of the output terminal consistent with the third level terminal under the control of the signal of the third node, and make a voltage of the fourth node consistent with the third level terminal under the control of the signal of the third node, wherein the pull-down sub-circuit comprises a fifth transistor connected between the third node and the idle output terminal, a sixth transistor connected between the first node and the second level terminal, a seventh transistor connected between the fourth node and the third level terminal, and a eighth transistor connected between the output terminal and the third level terminal;

the reset sub-circuit is connected to the reset terminal, the second level terminal, the first node and the second node, and is configured to make the voltages of the first node and the second node consistent with the second level terminal under the control of a signal of the reset terminal, wherein the reset sub-circuit comprises a ninth transistor connected between the reset terminal and the first node, and a tenth transistor connected between the second node and the second level terminal;

the idle output sub-circuit is connected to the first node, the second clock signal terminal and the idle output terminal, and is configured to output a signal of the second clock signal terminal at the idle output terminal under the control of the first node, wherein the idle output sub-circuit comprises an eleventh transistor, the eleventh transistor having a gate connected to the first node, a source connected to the second clock signal terminal, and a drain connected to the idle output terminal; and the output sub-circuit is connected to the first node, the second clock signal terminal and the output terminal, and is configured to output the signal of the second clock signal terminal at the output terminal under the control of the first node, wherein the output sub-circuit comprises a twelfth transistor, the twelfth transistor having a gate connected to the first node, a source connected to the second clock signal terminal, and a drain connected to the output terminal.

9. The display circuit according to claim 1, wherein each GOA unit comprises: a pull-up sub-circuit, a pull-down sub-circuit, a reset sub-circuit, an idle output sub-circuit and an output sub-circuit;

the pull-up sub-circuit is connected to the signal input terminal, a first level terminal, a first clock signal terminal, a second clock signal terminal, a first node, a second node, a third node and a fourth node, and is configured to make a voltage of the first node consistent with the signal input terminal, make a voltage of the second node consistent with the signal input terminal or make the voltage of the second node consistent with a voltage of the fourth node, make a voltage of the third node consistent with a voltage of the first level terminal, and make the voltage of the fourth node consistent with a voltage of the first clock signal terminal under the control of signals of the signal input terminal, the first level terminal, the first clock signal terminal and the second clock signal terminal, wherein the pull-up sub-circuit comprises a first transistor connected between the first level terminal and the third node, a second transistor connected between the signal input terminal and the second node, a third transistor connected between the second clock signal terminal and the fourth node, and a fourth transistor connected between the first clock signal terminal and the first node;

the pull-down sub-circuit is connected to a second level terminal, a third level terminal, the idle output terminal, the output terminal, the first node, the second node, the third node and the fourth node, and is configured to make a voltage of the third node consistent with the second level terminal under the control of a signal of the first node, make voltages of the first node consistent with the second node and the second level terminal under the control of a signal of the third node, make a voltage of the output terminal consistent with the second level terminal under the control of the signal of the third node, make a voltage of the output terminal consistent with the third level terminal under the control of the signal of the third node, and make a voltage of the fourth node consistent with the third level terminal under the control of the signal of the third node, wherein the pull-down sub-circuit comprises a fifth transistor connected between the third node and the idle output terminal, a sixth transistor connected between the first node and the second level terminal, a seventh transistor connected between the fourth node and the third level terminal, and a eighth transistor connected between the output terminal and the third level terminal;

the reset sub-circuit is connected to the reset terminal, the second level terminal, the first node and the second node, and is configured to make the voltages of the first node and the second node consistent with the second level terminal under the control of a signal of the reset terminal, wherein the reset sub-circuit comprises a ninth transistor connected between the reset terminal and the first node, and a tenth transistor connected between the second node and the second level terminal;

the idle output sub-circuit is connected to the first node, the second clock signal terminal and the idle output terminal, and is configured to output a signal of the second clock signal terminal at the idle output terminal under the control of the first node, wherein the idle output sub-circuit comprises an eleventh transistor, the eleventh transistor having a gate connected to the first node, a source connected to the second clock signal terminal, and a drain connected to the idle output terminal; and the output sub-circuit is connected to the first node, the second clock signal terminal and the output terminal, and is configured to output the signal of the second clock signal terminal at the output terminal under the control of the first node, wherein the output sub-circuit comprises a twelfth transistor, the twelfth transistor having a gate connected to the first node, a source connected to the second clock signal terminal, and a drain connected to the output terminal.

10. The display circuit according to claim 9, wherein a gate and a source of the first transistor are connected to the first level terminal, and a drain thereof is connected to the third node, a gate and a source of the second transistor are connected to the signal input terminal, and a drain thereof is connected to the second node, a gate of the third transistor is connected to the first node, a source thereof is connected to the second clock signal terminal, and a drain thereof is connected to the fourth node, and a gate of the fourth transistor is connected to the first clock signal terminal, a source thereof is connected to the second node, and a drain thereof is connected to the first node; and wherein the pull-up sub-circuit further comprises a thirteenth transistor, the thirteenth transistor having a gate connected to the idle output terminal, a source connected to the second node, and a drain connected to the fourth node.

11. The display circuit according to claim 9, wherein a gate of the fifth transistor is connected to the third node, a source thereof is connected to the idle output terminal, and a drain thereof is connected to the second level terminal, a gate of the sixth transistor is connected to the first node, a source thereof is connected to the third node, and a drain thereof is connected to the second level terminal, a gate of the seventh transistor is connected to the third node, a source thereof is connected to the fourth node, and a drain thereof is connected to the third level terminal, a gate of the eighth transistor is connected to the third node, a source thereof is connected to the output terminal, and a drain thereof is connected to the third level terminal; and wherein the pull-down sub-circuit further comprises a thirteenth transistor, the thirteenth transistor having a gate connected to the third node, a source connected to the second node, and a drain connected to the second level terminal, and a fourteenth transistor, the fourteenth transistor having a gate connected to the third node, a source connected to the first node, and a drain connected to the second node.

12. The display circuit according to claim 9, wherein a gate of the ninth transistor is connected to the reset terminal, a source thereof is connected to the first node, and a drain thereof is connected to the second node, and a gate of the tenth transistor is connected to the reset terminal, a source thereof is connected to the second node, and a drain thereof is connected to the second level terminal.

13. A display apparatus comprising the display circuit according to claim 1.

14. The display apparatus according to claim 13, wherein, in the first gate driving circuit, a signal input terminal of a first stage of GOA unit is input with a first frame start signal, and a reset terminal thereof is connected to an idle output terminal of a third stage of GOA unit;

a signal input terminal of a second stage of GOA unit is input with a second frame start signal;

a reset terminal of a 2n-th stage of GOA unit is connected to an idle output terminal of a (2n−1)-th stage of GOA unit and a signal input terminal of a (2n+1)-th stage of GOA unit;

a reset terminal of the (2n+1)-th stage of GOA unit is connected to an idle output terminal of a (2n+3)-th stage of GOA unit;

a signal input terminal of a (2n+2)-th stage of GOA unit is connected to an idle output terminal of a 2n-th stage of GOA unit.

15. A driving method of a display circuit according to claim 1, comprising following steps:

inputting the first gate driving signal to the pixel unit by the first gate driving circuit;

inputting the second gate driving signal to the pixel unit by the second gate driving circuit; and controlling the pixel unit to perform threshold compensating and gray scale displaying simultaneously by the first gate driving signal and the second gate driving signal.

16. The driving method according to claim 15, wherein the first gate driving signal and the second gate driving signal are multi-pulse signals.

17. The driving method according to claim 15, wherein the first gate driving signal is a pulse signal comprising at least two kinds of pulse width, and/or the second gate driving signal is a pulse signal comprising at least two kinds of pulse width.

* * * * *